(12) United States Patent
Abe

(10) Patent No.: US 7,685,546 B2
(45) Date of Patent: Mar. 23, 2010

(54) METHOD AND APPARATUS FOR SUPPORTING VERIFICATION, AND COMPUTER PRODUCT

(75) Inventor: Kenji Abe, Kawasaki (JP)

(73) Assignee: Fujitsu Microelectronics Limited, Yokohama (JP)

(*) Notice: Subject to any disclaimer, the term of this patent is extended or adjusted under 35 U.S.C. 154(b) by 240 days.

(21) Appl. No.: 11/747,026

(22) Filed: May 10, 2007

(65) Prior Publication Data
US 2007/0234250 A1 Oct. 4, 2007

Related U.S. Application Data

(62) Division of application No. 11/101,520, filed on Apr. 8, 2005, now abandoned.

(30) Foreign Application Priority Data
Dec. 28, 2004 (JP) .............................. 2004-381855

(51) Int. Cl.
G06F 17/50 (2006.01)
G06F 9/45 (2006.01)
(52) U.S. Cl. ............................................. 716/5; 716/2
(58) Field of Classification Search .................... 716/2, 716/5
See application file for complete search history.

(56) References Cited

U.S. PATENT DOCUMENTS

| 5,751,592 | A | 5/1998 | Takai et al. |
| 5,870,308 | A | 2/1999 | Dangelo et al. |
| 6,530,054 | B2 | 3/2003 | Hollander |
| 6,678,841 | B1 | 1/2004 | Kurosawa et al. |
| 6,718,521 | B1 | 4/2004 | Bentlage et al. |
| 2002/0091990 | A1* | 7/2002 | Little et al. ................. 717/105 |
| 2003/0126586 | A1* | 7/2003 | Sluiman et al. ............. 717/124 |
| 2005/0004777 | A1* | 1/2005 | Houlihane .................. 702/119 |
| 2005/0071720 | A1* | 3/2005 | Dattaram Kadkade et al. ... 714/741 |

FOREIGN PATENT DOCUMENTS

JP 2004-185592 7/2004

OTHER PUBLICATIONS

Office Action mailed Jul. 14, 2006 in corresponding U.S. Appl. No. 11/101,520.

* cited by examiner

*Primary Examiner*—Jack Chiang
*Assistant Examiner*—Suresh Memula
(74) *Attorney, Agent, or Firm*—Staas & Halsey LLP

(57) ABSTRACT

A verification supporting apparatus includes an acquiring unit that acquires a first verification-item list for a verification target, a functional specification of the verification target, and a sequential specification of the verification target; a keyword extracting unit that extracts a keyword about the verification target from the first verification-item list; a creating unit that creates a second verification-item list in which each of the verification items is formed with the functional description and the sequential description about an output action of the verification target; and a converting unit that converts the first verification-item list into a third verification-item list having a same format as the second verification-item list, based on the second verification-item list and the keyword.

9 Claims, 14 Drawing Sheets

| NO. | VERIFICATION DETAIL |
|---|---|
| (1) | IS IT POSSIBLE TO READ READ-DATA FROM RAM PROPERLY? |
| (2) | IS IT POSSIBLE TO WRITE WRITE-DATA IN RAM PROPERLY? |
| (3) | IS IT POSSIBLE TO RESET DURING READ/WRITE WITHOUT CAUSING HANG-UP? |

| USE CASE DESCRIPTION | SEQUENCE DESCRIPTION (MESSAGE) |
|---|---|
| READ | READ-ADDRESS |
| | READ-RESPONSE |
| | READ-DATA |
| WRITE | WRITE-ADDRESS |
| | WRITE-DATA |
| | WRITE-RESPONSE |

| USE CASE DESCRIPTION | SEQUENCE DESCRIPTION (MESSAGE) |
|---|---|
| READ | READ-DATA |
| WRITE | WRITE-DATA |

| VERIFICATION ITEM | USE CASE DESCRIPTION | SEQUENCE DESCRIPTION (MESSAGE) | VERIFICATION DETAIL COVERAGE 33% |
|---|---|---|---|
| | READ | READ-ADDRESS | [ADDED] |
| | | READ-RESPONSE | [ADDED] |
| | | READ-DATA | IS IT POSSIBLE TO READ READ-DATA FROM RAM PROPERLY? |
| | WRITE | WRITE-ADDRESS | [ADDED] |
| | | WRITE-DATA | IS IT POSSIBLE TO WRITE WRITE-DATA IN RAM PROPERLY? |
| | | WRITE-RESPONSE | [ADDED] |
| [REVIEW ITEM] | | | IS IT POSSIBLE TO RESET DURING READ/WRITE WITHOUT CAUSING HANG-UP? |

| USE CASE DESCRIPTION | SEQUENCE DESCRIPTION (MESSAGE) |
|---|---|
| READ | READ-ADDRESS |
|  | READ-RESPONSE |
|  | READ-DATA |
| WRITE | WRITE-ADDRESS |
|  | WRITE-DATA |
|  | WRITE-RESPONSE |
| CLEAR | CLEAR-REQUEST |
|  | CLEAR-RESPONSE |

| VERIFICATION ITEM | | ADDITIONAL-VERIFICATION REQUIREMENT RATE: 25% | |
|---|---|---|---|
| USE CASE DESCRIPTION | SEQUENCE DESCRIPTION (MESSAGE) | VERIFICATION DETAIL | |
| READ | READ-ADDRESS | [COMPLETED] | |
| | READ-RESPONSE | [COMPLETED] | |
| | READ-DATA | [COMPLETED] | |
| WRITE | WRITE-ADDRESS | [COMPLETED] | |
| | WRITE-DATA | [COMPLETED] | |
| | WRITE-RESPONSE | [COMPLETED] | |
| CLEAR | CLEAR-REQUEST | [ADDED] | |
| | CLEAR-RESPONSE | [ADDED] | |

METHOD AND APPARATUS FOR SUPPORTING VERIFICATION, AND COMPUTER PRODUCT

CROSS-REFERENCE TO RELATED APPLICATIONS

This application is a divisional of U.S. patent application Ser. No. 11/101,520, filed Apr. 8, 2005 now abandoned and is based upon and claims the benefit of priority from the prior Japanese Patent Application No. 2004-381855, filed on Dec. 28, 2004, the entire contents of which are incorporated herein by reference.

BACKGROUND OF THE INVENTION

1. Field of the Invention

The present invention relates to a method and an apparatus for supporting verification in large-scale integration (LSI) design, and a computer product.

2. Description of the Related Art

In LSI design, improvement of work efficiency by shortening a design period has conventionally been demanded. However, in the LSI design, a verification process, which is rather time consuming, to verify whether an LSI properly operates is essential. Especially for an LSI that is required to be large-scale, to have high performance, to be high-speed, and to be low-power consuming, the verification process is important to maintain high quality.

In the verification process currently carried out, a verification item list in a free format is used. The verification item list is formed in a table, and verification items that are extracted from a specification of an LSI by a third party, such as an outsider, an outside segment, and an outside company, are listed up in the table. A format of the verification item list is not standardized, and is different among third parties.

Moreover, a technology for objectively evaluating necessity and sufficiency of the verification items in the verification item list has not been established. Therefore, there is no numerical ground that the verification items are necessary and sufficient. With such reason, currently, the verification process is carried out while a person that is engaged in the verification process (a designer of the LSI) or other members review whether all necessary verification items are picked up from the specification of the LSI.

On the other hand, an apparatus for supporting the verification process is proposed. In the apparatus, the verification list is automatically obtained by using a computer-readable electronic specification that is written in an object oriented unified modeling language (UML). Such a technology is disclosed in, for example, Japanese Patent Application Laid-Open No. 2004-185592. The apparatus includes a functional-structure-information input unit, a condition input unit, a verification-item-function creating unit, and a verification-item extracting unit. The functional-structure-information input unit inputs functional structure information that indicates functions of a verification target device to be verified whether the verification target device operates properly. The condition input unit inputs conditions relating to input/output sequences to be provided to the verification target device. The verification-item-function creating unit creates a verification item function that completely satisfies the conditions based on the functional structure information. The verification-item extracting unit extracts a combination of elements that form the functional structure information as a verification item, based on the verification item function.

In the above conventional verification process that includes a review process, a result of review for evaluating a quality of the verification items is dependent on experience and ability of the members involved in the review. In other words, in the conventional verification process, the verification items are extracted without reference.

Therefore, in some cases, necessary verification items are missed to be extracted, or unnecessary verification items are undesirably extracted. Thus, the result of the review varies, and verification coverage obtained as a result of the review decreases. In addition, this reduces a yield in actual manufacturing of the LSI.

Moreover, because the review requires 3 to 10 people or more to be involved as review members, schedule arrangement itself can be a trouble for a coordinator, taking time and labor. In addition, if the schedule arrangement does not proceed smoothly, a reviewing period becomes long. Thus, a total time required for the LSI design increases. Furthermore, the review usually requires about two hours to half a day. This not only makes the verification period long, but also causes a delay in other processes in the LSI design because of binding hours constraints for the members.

In the conventional technology disclosed in the patent literature, it is possible to automatically obtain an updated verification item list created based on an updated electronic specification, even if the electronic specification is updated for an additional function of the LSI. However, to identify new verification items added in the updated verification item list, it is necessary to manually compare the verification item list before update of the electronic specification and the updated item list. Therefore, the verification process requires a great deal of time and labor. This makes the design period long, and increases manufacturing cost.

SUMMARY OF THE INVENTION

It is an object of the present invention to solve at least the above problems in the conventional technology.

A verification supporting apparatus according to one aspect of the present invention includes an acquiring unit that acquires a first verification-item list in which a verification item that indicates a content of verification for a verification target is listed in an arbitrary format, a functional specification that is an electronic specification including a functional description specifying a function of the verification target, and a sequential specification that is an electronic specification including a sequential description specifying a sequence of the verification target; a keyword extracting unit that extracts a keyword about the verification target from the first verification-item list; a creating unit that creates a second verification-item list that includes verification items in a format in which each of the verification items is formed with the functional description and the sequential description about an output action of the verification target; and a converting unit that converts the first verification-item list into a third verification-item list having a same format as the second verification-item list, based on the second verification-item list and the keyword.

A verification supporting method according to another aspect of the present invention includes acquiring a first verification-item list in which a verification item that indicates a content of verification for a verification target is listed in an arbitrary format, a functional specification that is an electronic specification including a functional description specifying a function of the verification target, and a sequential specification that is an electronic specification including a sequential description specifying a sequence of the verification target; extracting a keyword about the verification target from the first verification-item list; creating a second verification-item list that includes verification items in a format in which each of the verification items is formed with the functional description and the sequential description about an output action of the verification target; and converting the first verification-item list into a third verification-item list having a same format as the second verification-item list, based on the second verification-item list and the keyword.

A computer-readable recording medium according to still another aspect of the present invention stores a verification supporting program that makes a computer execute the above verification supporting method according to the present invention.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 12 is a table of a third verification item list;

FIG. 13 is a table of an evaluation list;

FIG. 16 is a table of a fourth verification-item list;

FIG. 17 is a table of an evaluation list obtained as a result of additional verification;

DETAILED DESCRIPTION OF THE PREFERRED EMBODIMENTS

Exemplary embodiments according to the present invention will be explained in detail with reference to the accompanying drawings.

Figure 1:
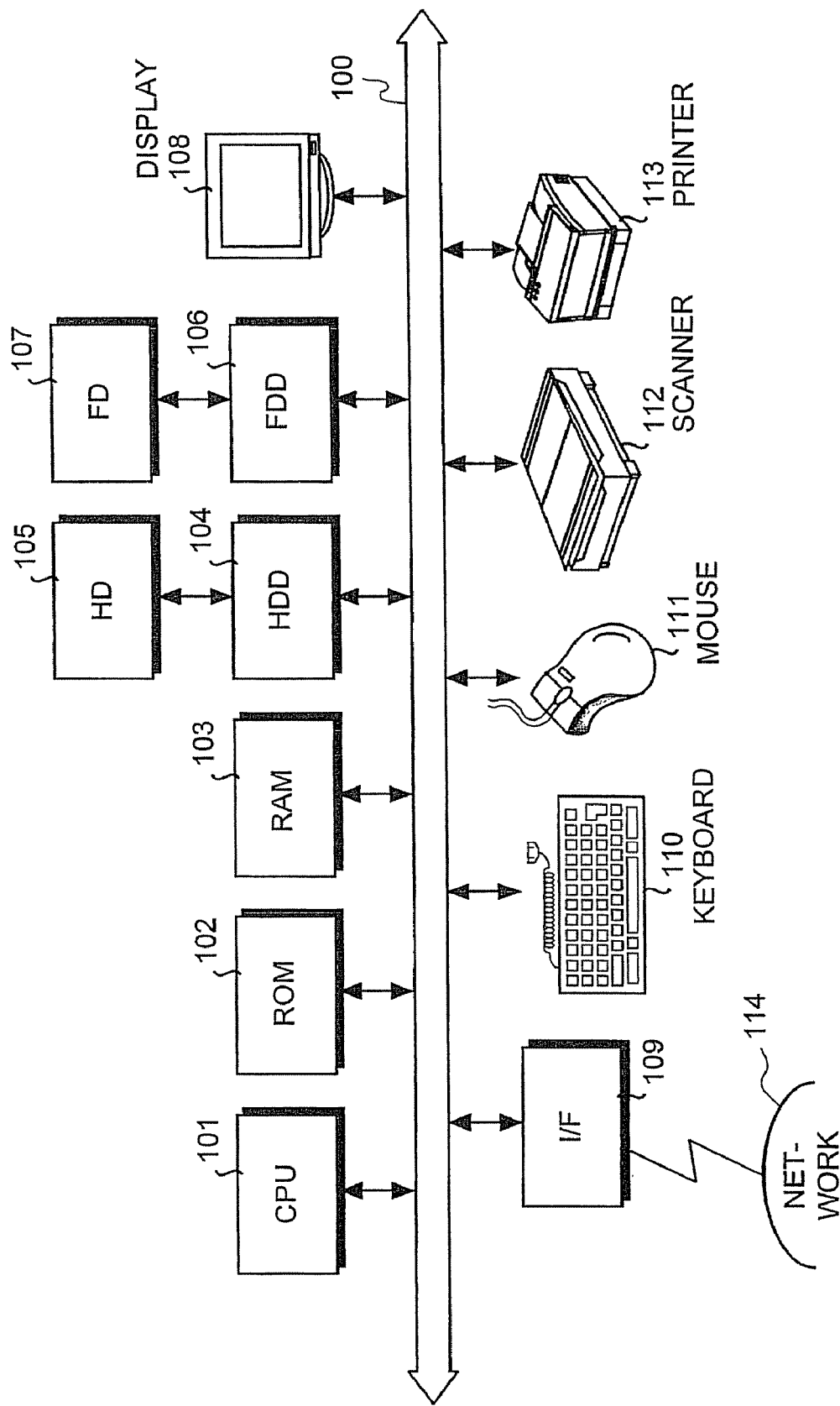
FIG. 1 is a schematic of a hardware configuration of an apparatus for supporting verification according to an embodiment of the present invention.

FIG. 1 is a schematic of a hardware configuration of an apparatus for supporting verification according to an embodiment of the present invention. As shown in FIG. 1, the apparatus includes a central processing unit (CPU) 101, a read only memory (ROM) 102, a random access memory (RAM) 103, a hard disk drive (HDD) 104, a hard disk (HD) 105, a flexible disk drive (FDD) 106, a flexible disk (FD) 107 as a removable recording medium, a display 108, an interface (I/F) 109, a keyboard 110, a mouse 111, a scanner 112, and a printer 113. Each of components is connected through a bus 100.

The CPU 101 controls a whole of the apparatus. The ROM 102 stores a computer program such as a boot program. The RAM 103 is used as a work area of the CPU 101. The HDD 104 controls read/write of data from/to the HD 105 in accordance with the control of the CPU 101. The HD 105 stores data that is written in accordance with the control of the HDD 104.

The FDD 106 controls read/write of data from/to the FD 107 in accordance with the control of the CPU 101. The FD107 stores data that is written by a control of the FDD 106 and lets the apparatus read the data stored in the FD 107.

Apart from the FD 107, a compact disc-read only memory (CD-ROM), a compact disc-readable (CD-R), a compact disc-rewritable (CD-RW), a magnetic optical disc (MO), a digital versatile disc (DVD), and a memory card may also be used as the removable recording medium. The display 108 displays a curser, an icon, a tool box as well as data such as documents, images, and functional information. A cathode ray tube (CRT), a thin film transistor (TFT) liquid crystal display, or a plasma display can be used as the display 108.

The I/F 109 is connected to a network 114 such as the Internet through a communication line and is connected to other devices through the network 114. The I/F 109 controls the network 114 and an internal interface to control input/output of data to/from external devices. A modem or a local area network (LAN) adapter can be used as the I/F 109.

The keyboard 110 includes keys for inputting characters, numbers, and various instructions, and is used to input data. A touch panel input pad or a numerical key pad may also be used as the keyboard 110. The mouse 111 is used to shift the curser, select a range, shift windows, and change sizes of the windows on a display. A track ball or a joy stick may be used as a pointing device if functions similar to those of the mouse 111 are provided.

The scanner 112 optically captures an image and inputs image data to the apparatus. The scanner 112 may be provided with an optical character read (OCR) function. The printer 113 prints the image data and document data. For example, a laser printer or an inkjet printer may be used as the printer 113.

Figure 2:
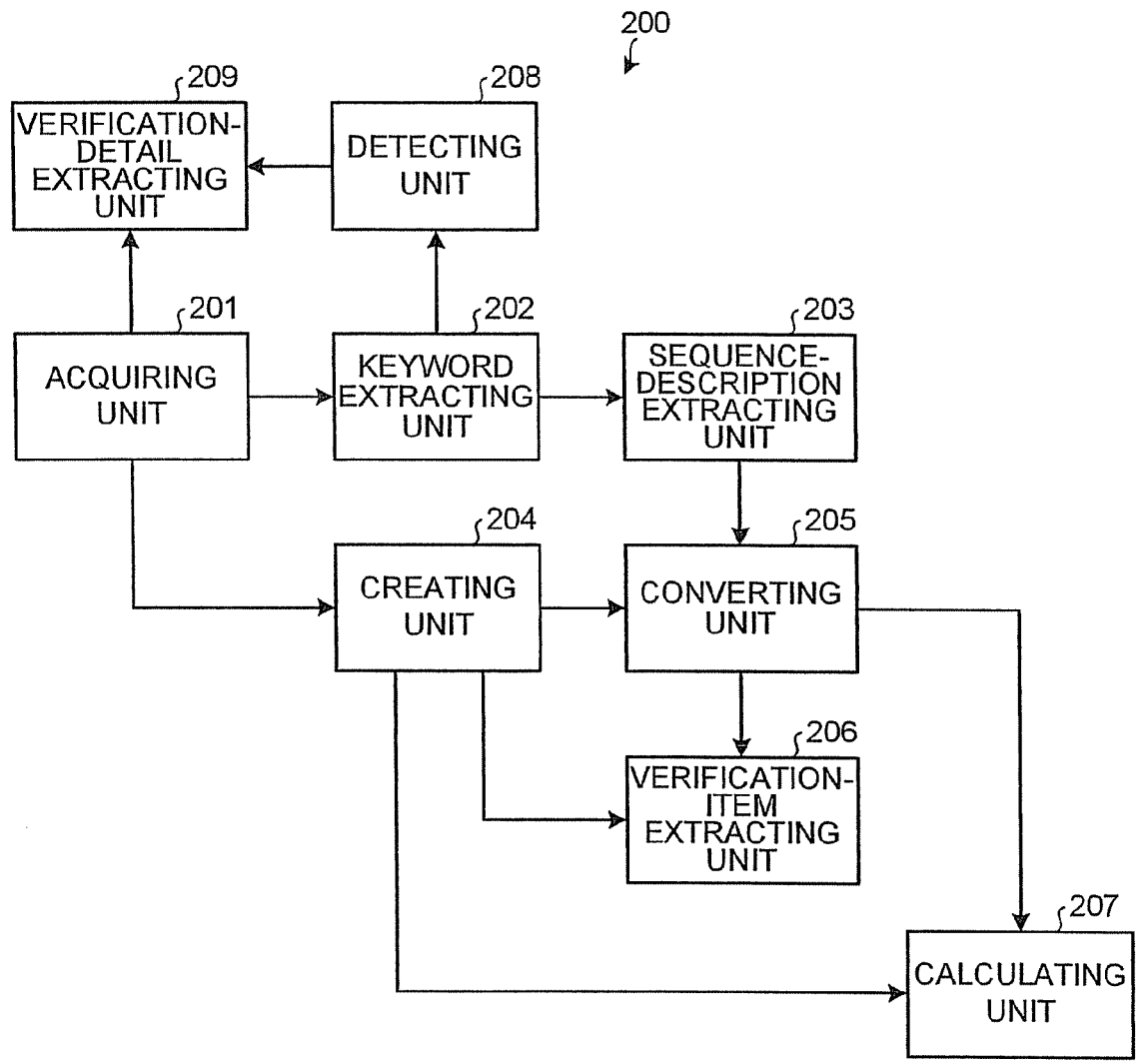
FIG. 2 is a block diagram of a functional configuration of the apparatus according to the present embodiment.

FIG. 2 is a block diagram of a functional configuration of the apparatus according to the present embodiment. As shown in FIG. 2, an apparatus for supporting verification 200 includes an acquiring unit 201, a keyword extracting unit 202, a sequential description extracting unit 203, a creating unit 204, a converting unit 205, a verification-item extracting unit 206, a calculating unit 207, a detecting unit 208, and a verification-content extracting unit 209.

The acquiring unit acquires a first verification-item list, an electronic specification that specifies functions of a verification target (hereinafter, "functional specification"), and an electronic specification that specifies a sequence of the verification target (hereinafter, "sequential specification"). The verification target is an LSI that is required to be verified.

Figure 3:
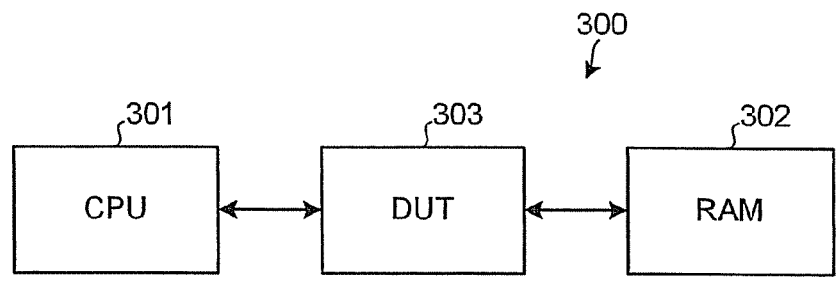
FIG. 3 is a block diagram of a system LSI that includes a verification target.

FIG. 3 is a block diagram of a system LSI that includes the verification target. As shown in FIG. 3, a system LSI 300 includes a CPU 301, a RAM 302, and a device under test (DUT) 303. The DUT 303 is the verification target, and in this example, the DUT 303 represents a RAM interface with which data is communicated between the CPU 301 and the RAM 302.

The first verification-item list is electronic information that includes verification contents written in a free format. Specifically, the first verification-item list is formed in a format of table, and in the table, verification items that are extracted from a specification of an LSI by a third party, such as an outsider, an outside segment, and an outside company, are listed up. A format of the first verification-item list is not standardized, and is different among third parties. Generally, the first verification-item list is called a golden verification item list without any inadequacy.

Figures 4, 5:
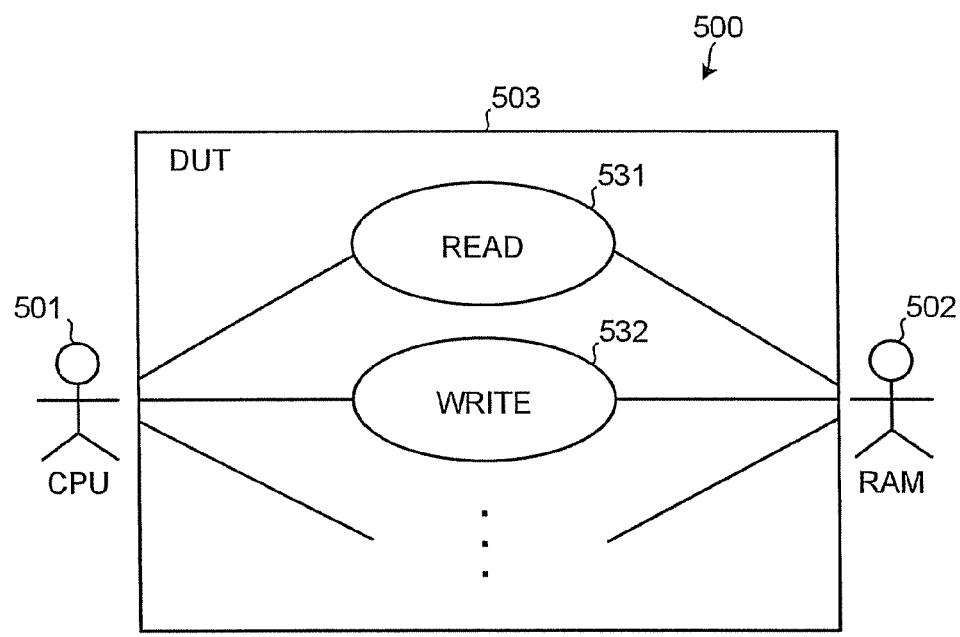
FIG. 4 is a table of a first verification-item list.
FIG. 5 is a schematic of a functional specification of the verification target.

FIG. 4 is a table of the first verification-item list. A first verification-item list 400 shown in FIG. 4 is a group of the verification items for the DUT 303. The first verification-item list includes verification items 401 to 403. Verification contents of the verification items 401 to 403 are written in a text format, and the verification contents of each of the verification items 401 to 403 are as follows.

Verification item (1): Is it possible to read read-data from a RAM properly?

Verification item (2): Is it possible to write write-data in a RAM properly?

Verification item (3): Is it possible to reset during read/write without causing a hang-up?

The electronic specification is a computer-readable electronic specification that is written in an object oriented language, such as the UML. The functional specification specifies functions of the verification target. Specifically, the functional specification can be written in a form of a use case diagram in the UML. The sequential specification specifies a sequence of the verification target. Specifically, the sequential specification can be written in a form of a sequence diagram in the UML.

Figure 6:
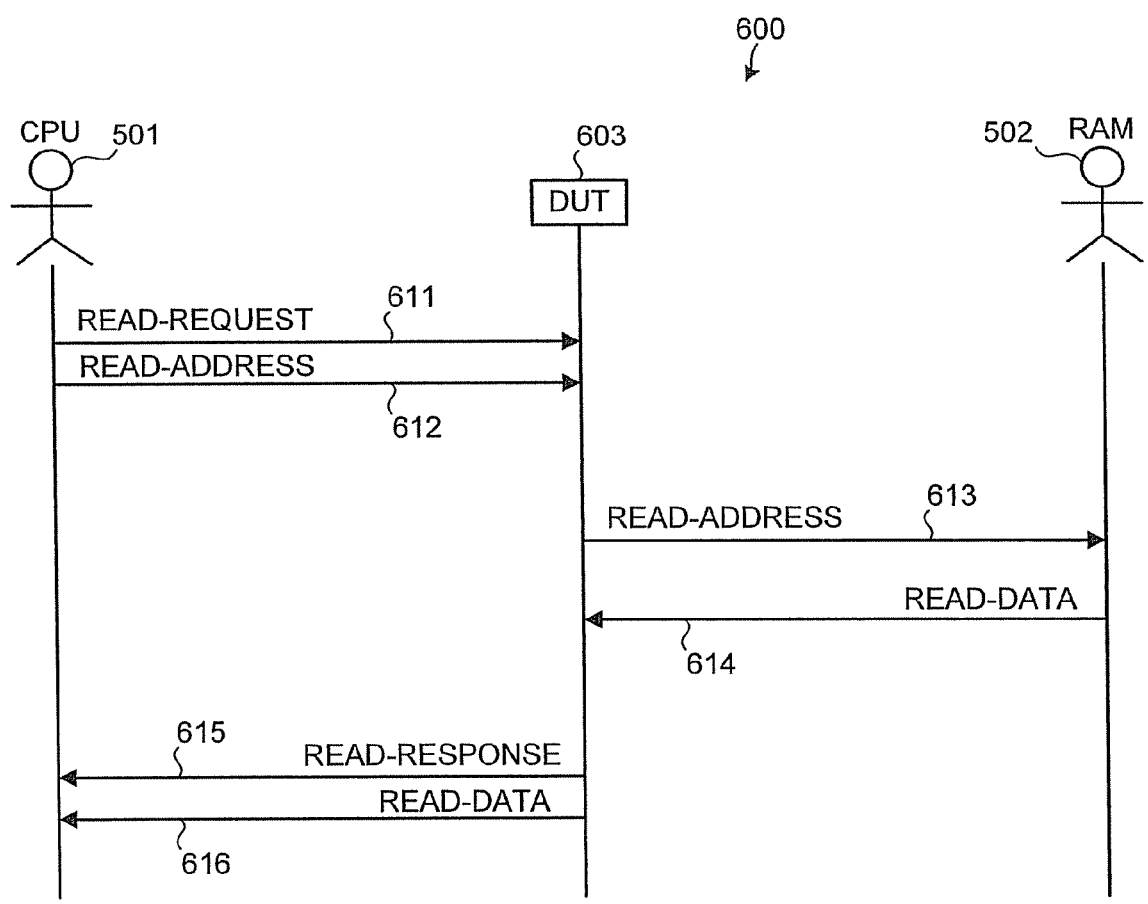
FIG. 6 is a schematic of a sequential specification relating to a read action of the verification target.
Figure 7:
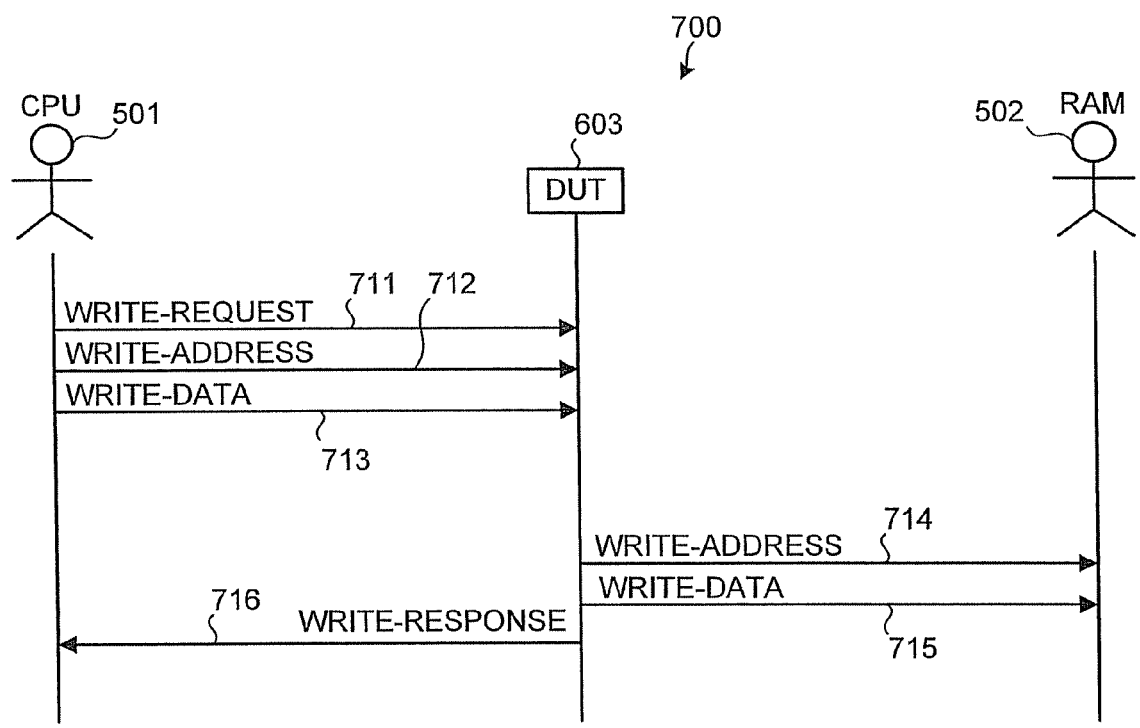
FIG. 7 is a schematic of a sequential specification relating to a write action of the verification target.

FIG. 5 is a schematic of the functional specification of the verification target. FIGS. 6 and 7 are schematics of the sequential specification of the verification target. As an example of the functional specification, a use case diagram 500 written in the UML is shown in FIG. 5. The use case diagram 500 indicates a function of the DUT 303 shown in FIG. 3.

As shown in FIG. 5, the use case diagram 500 includes actors 501 and 502, and a system 503. The actor 501 represents the CPU 301, and the actor 502 represents the RAM 302. The system 503 represents the DUT 303, and includes use case descriptions that indicate functions of the DUT 303. The use case descriptions shown in FIG. 5 includes a use case description 531 that indicates a read function of the DUT 303 and a use case description 532 that indicates a write function of the DUT 303.

As examples of the sequential specification, sequence diagrams 600 and 700 are shown in FIGS. 6 and 7 respectively. The sequence diagram 600 indicates the read action of the DUT 303, and the sequence diagram 700 indicates the write action of the DUT 303. The sequence diagram 600 includes the actors 501 and 502, an object 603, and messages 611 to 616. Each of an actor name "CPU" of the actor 501, the actor name "RAM" of the actor 502, an object name "DUT" of the object 603 is a sequential description that indicates an action target in the sequence diagram 600 (and in the sequence diagram 700 and a sequence diagram 1500).

The message 611 is a sequential description that indicates an action of transmitting a read-request from the actor 501 to the object 603. The message 612 is a sequential description that indicates an action of transmitting a read-address from the actor 501 to the object 603. The message 613 is a sequential description that indicates an action of transmitting a read-address from the object 603 to the actor 502.

The message 614 is a sequential description that indicates an action of transmitting read-data from the actor 502 to the object 603. The message 615 is a sequential description that indicates an action of transmitting a read-response from the object 603 to the actor 501. The message 616 is a sequential description that indicates an action of transmitting the read-data from the object 603 to the actor 501.

The sequence diagram 700 shown in FIG. 7 includes the actors 501 and 502, the object 603, and messages 711 to 716. The message 711 is a sequential description that indicates an action of transmitting a write-request from the actor 501 to the object 603. The message 712 is a sequential description that indicates an action of transmitting an action of transmitting a write-address form the actor 501 to the object 603. The message 713 is a sequential description that indicates an action of transmitting a write-data from the actor 501 to the object 603

The message 714 is a sequential description that indicates an action of transmitting write-address from the object 603 to the actor 502. The message 715 is a sequential description that indicates an action of transmitting a write-data from the object 603 to the actor 501. The message 716 is a sequential description that indicates an action of transmitting a write-response from the object 603 to the actor 501.

The acquiring unit 201 acquires the first verification-item list 400 and the electronic specification by receiving the first verification-item list 400 and the electronic specification from an external server through the network 114 or by selecting from a database with operation of the keyboard 110 or the mouse 111 shown in FIG. 1. Specifically, a function of the acquiring unit 201 is realized by the CPU 101 executing a computer program that is recorded in, for example, the ROM 102, the RAM 103, the HD 105, and the FD 107, or by the I/F 109 shown in FIG. 1.

The keyword extracting unit 202 shown in FIG. 2 extracts keywords relating to the verification target (hereinafter, "verification keyword") from the first verification-item list 400 acquired. Specifically, the keyword extracting unit 202 extracts the verification keywords by extracting nouns from descriptions of the verification contents of the verification items 401 to 403 in the first verification-item list 400.

For example, from the verification content, "is it possible to read read-data from a RAM?" of the verification item 401, "read-data" and "RAM" can be extracted. In a similar manner, from the verification content, "is it possible to write write-data in a RAM?" of the verification item 402, "write-data" and "RAM" can be extracted. Moreover, from the verification content, "is it possible to reset during read/write without causing a hang-up?", "read/write", "reset", and "hang-up" can be extracted.

A verification keyword database (not shown) may be prepared in advance, and the verification keywords may be extracted by extracting, from the first verification-item list 400, verification keywords that match with verification keywords included in the verification keyword database.

Figure 8:
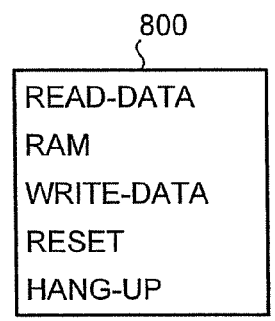
FIG. 8 is a schematic of a verification keyword list.

FIG. 8 is a schematic of a verification keyword list thus listed up. When the verification keyword database includes "read-data", "RAM", "write-data", "reset", and "hang-up", keywords, "read-data", "RAM", "write-data", "reset", and "hang-up", can be extracted from the verification items 401 to 403.

A verification keyword list 800 in which these keywords extracted are compiled are shown in FIG. 8. Specifically, a function of the keyword extracting unit 202 is realized by the CPU 101 executing a computer program that is recorded in, for example, the ROM 102, the RAM 103, the HD 105, and the FD 107 shown in FIG. 1.

The sequential description extracting unit 203 shown in FIG. 2 extracts, from the sequential specification, sequential descriptions that do not match with the verification keywords extracted. Specifically, the sequential description extracting unit 203 extracts sequential descriptions that do not match with the verification keywords extracted from among sequential descriptions relating to an output action of the object 603 (DUT 303) in the sequence diagrams 600 and 700 shown in FIGS. 6 and 7 respectively.

Figure 9:
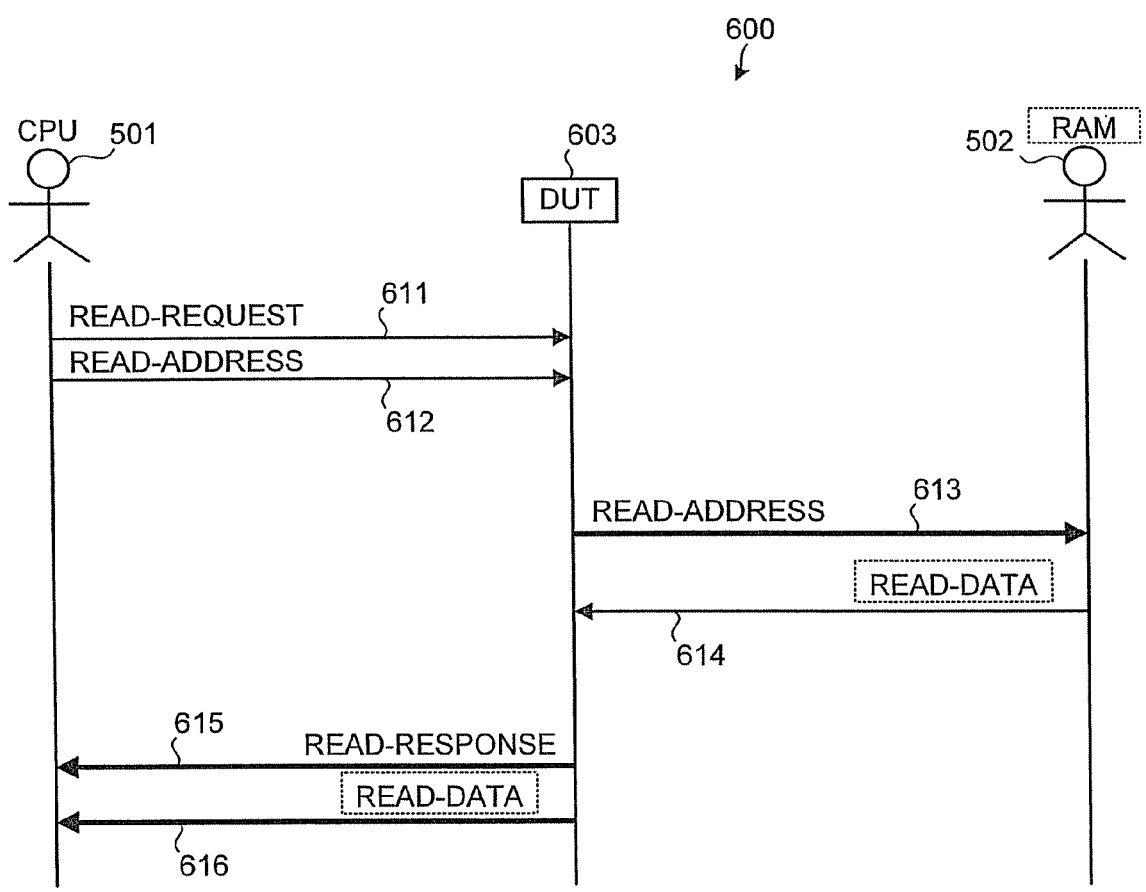
FIG. 9 is a schematic for explaining extraction of a sequential description from a sequence diagram relating to the read action.

FIG. 9 is a schematic for explaining extraction of a sequential description from the sequence diagram 600 relating to a read action. In FIG. 9, the messages 613, 615, and 616 shown with bold arrows represent the sequential descriptions that indicate the output action of the object 603 (DUT 303).

The actor 502 and the messages 614 and 616 in a broken-line-box in FIG. 9, represent the sequential descriptions that match with the verification keywords in the verification keyword list 800 shown in FIG. 8. Therefore, the sequential description extracting unit 203 extracts the messages 613 and 615 that are not in the broken-line-box, namely "read-address" and "read-response", from among the messages 613, 615, and 616 shown with bold lines in FIG. 9.

Figures 10, 11:
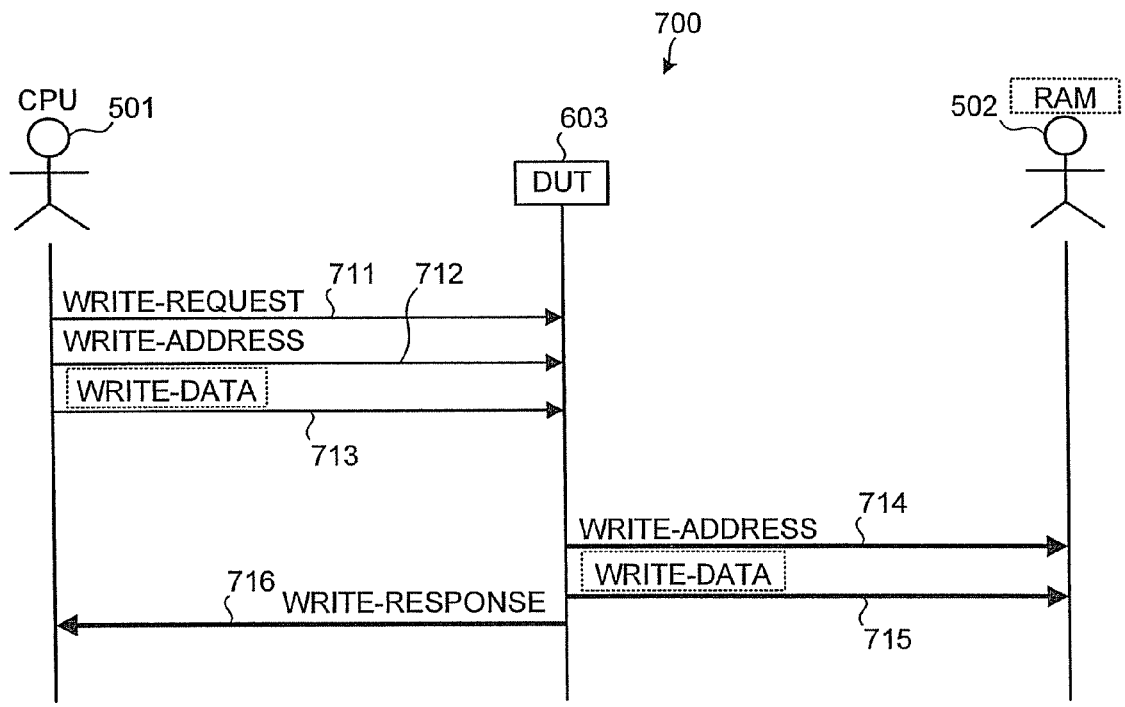
FIG. 10 is a schematic for explaining extraction of a sequential description from a sequence diagram relating to the write action.
FIG. 11 is a table of a second verification-item list.

FIG. 10 is a schematic for explaining extraction of a sequential description from the sequence diagram 700 relating to a write action. In FIG. 10, the messages 713 to 716 shown with bold arrows represent the sequential descriptions that indicate the output action of the object 603 (DUT 303).

The actor 502 and the messages 714 and 715 in a broken-line-box in FIG. 10, represent the sequential descriptions that match with the verification keywords in the verification keyword list 800 shown in FIG. 8. Therefore, the sequential description extracting unit 203 extracts the messages 714 and 716 that are not in the broken-line-box, namely "write-address" and "write-response", from among the messages 714 to 716 shown with bold lines in FIG. 10

Specifically, a function of the sequential description extracting unit 203 is realized by the CPU 101 executing a computer program that is recorded in, for example, the ROM 102, the RAM 103, the HD 105, and the FD 107 shown in FIG. 1.

The creating unit 204 creates a fourth verification-item list based on a functional description in the latest functional specification and a sequential description, which relates to the output action of the verification target, in the latest sequential specification. The fourth verification-item list is formed in a format in which a verification item in the fourth verification-item list is formed with the function description in the latest functional specification and the sequential description in the latest sequential specification.

For example, the second verification-item list may be formed in such a format that a verification item included in the second verification-item list is formed with the use case description in the use case diagram 500 shown in FIG. 5 and the sequential description in the sequence diagrams 600 and 700 shown in FIGS. 6 and 7 respectively.

FIG. 11 is a table of the second verification-item list. As shown in FIG. 11, a second verification-item list 1100 is formed in the format in which a verification item in the second verification-item list 1100 is formed with the use case description and the sequential description (message). If the use case diagram 500 is acquired, the use case descriptions in the second verification-item list 1100 are "read" of the use case description 531 and "write" of the use case description 532.

Similarly, if the sequence diagrams 600 and 700 are acquired, the sequential descriptions in the second verification-item list 1100 are the messages 613, 615, and 616 ("read-address", "read-response", and "read-data"), and the messages 714 to 716 ("write-address", "write-data", and "write-response").

A correspondence between the use case description and the sequential description can be determined based on a connection between the use case description and the actors in the use case diagram 500, and input and output of the messages that occur between the actors and the object in the sequence diagrams 600 and 700. Specifically, a function of the creating unit 204 is realized by the CPU 101 executing a computer program that is recorded in, for example, the ROM 102, the RAM 103, the HD 105, and the FD 107 shown in FIG. 1.

The converting unit 205 shown in FIG. 2 converts, based on the second verification-item list 1100 and the verification keywords extracted, a format of the first verification-item list 400 into a format identical to the format of the second verification-item list 1100 to create a third verification item list. Specifically, the converting unit 205 converts the format of the first verification-item list 400 by deleting the sequential descriptions that are extracted by sequential description extracting unit 203 from the sequential descriptions in the second verification-item list 1100.

More specifically, from the sequential descriptions in the second verification-item list 1100, namely, the messages 613, 615, 616 ("read-address", "read-response", and "read-data") and 714 to 716 ("write-address", "write-data", and "write-response"), the sequential descriptions that are extracted by sequential description extracting unit 203 are deleted. The sequential descriptions to be deleted are "read-address" of the message 613, "read-response" of the message 615, "write-address" of the message 714, and "write-response" of the message 716.

The third verification item list thus created is shown in FIG. 12. FIG. 12 is a table of the third verification item list. A third verification item list 1200 shown in FIG. 13 is formed in a format in which a verification item in the third verification item list 1200 is formed with the use case description and the sequential description. Thus, the formats of the first verification-item list 400 and the second verification-item list 1100 are unified by providing the converting unit 205. Specifically, a function of the converting unit 205 is realized by the CPU 101 executing a computer program that is recorded in, for example, the ROM 102, the RAM 103, the HD 105, and the FD 107 shown in FIG. 1.

The verification-item extracting unit 206 shown in FIG. 2 extracts, from the second verification-item list 1100, verification items that are not included in the third verification item list 1200. Specifically, the verification-item extracting unit 206 extracts the verification item of which the use case description is "read" and the sequential description is "read-address", the verification item of which the use case description is "read" and the sequential description is "read-response", the verification item of which the use case description is "write" and the sequential description is "write-address", and the verification item of which the use case description is "write" and the sequential description is "write-response" as the verification items that are not included in the third verification item list 1200.

Thus, verification item that are missed to be included in the first verification-item list 400 can be identified. Specifically, a function of the verification-item extracting unit 206 is realized by the CPU 101 executing a computer program that is recorded in, for example, the ROM 102, the RAM 103, the HD 105, and the FD 107 shown in FIG. 1.

The calculating unit 207 calculates coverage based on the second verification-item list 1100 and the third verification item list 1200. The coverage is a rate that indicates completeness of the first verification-item list 400 in covering the verification items of the second verification-item list 1100, and is expressed in a fraction or a percentage. For example, the number of the verification items in the second verification-item list 1100 shown in FIG. 11 is six. The number of the verification items in the third verification item list 1200 shown in FIG. 12 is two. Therefore, the coverage is ⅔, that is 33%.

Thus, a reference for completing the verification process can be set, and the first verification-item list 400 can be an evaluation reference for the completeness of verification. Specifically, a function of the verification-item extracting unit 206 is realized by the CPU 101 executing a computer program that is recorded in, for example, the ROM 102, the RAM 103, the HD 105, and the FD 107 shown in FIG. 1.

The detecting unit 208 detects a verification keyword that does not match with the sequential descriptions in the sequential specification in the verification keywords extracted by the keyword extracting unit 202. For example, the detecting unit 208 detects "reset" and "hang-up" in the verification keyword list 800 shown in FIG. 8 as the verification keywords that do not match with the sequential descriptions in the sequence diagrams 600 and 700. Specifically, a function of the detecting unit 208 is realized by the CPU 101 executing a computer program that is recorded in, for example, the ROM 102, the RAM 103, the HD 105, and the FD 107 shown in FIG. 1.

The verification-content extracting unit 209 extracts a verification content that includes the verification keyword detected by the detecting unit 208 from among the verification contents in the first verification-item list 400. Specifically, the verification-content extracting unit 209 extracts, from the first verification-item list 400, the verification content that includes the verification keywords, "rest" and "hang-up", which is the verification content, "is it possible to reset during read/write without causing a hang-up?" of the verification item 403.

Thus, it is possible to automatically detect, in the first verification-item list 400, a verification item that includes a verification content required to be reviewed. By reviewing the verification content detected, it is possible to determine which of the functional specification, the sequential specification, or the verification items listed up in the first verification-item list 400 an error is originated to. Specifically, a function of the verification-content extracting unit 209 is realized by the CPU 101 executing a computer program that is recorded in, for example, the ROM 102, the RAM 103, the HD 105, and the FD 107 shown in FIG. 1.

FIG. 13 is a table of an evaluation list that is obtained by the apparatus 200. The evaluation list includes FIG. 12 the second verification-item list 1100. For the verification items extracted by the verification-item extracting unit 206, a description "added" is written in the verification content.

For verification items that are not extracted by the verification-item extracting unit 206, the verification content of the verification item that includes the sequential description in the third verification item list 1200 is written. Specifically, for the verification item of which the use case description is "read" and the sequential description is "read-data" shown in FIG. 13, the verification content, "is it possible to read read-data from a RAM properly?" of the verification item 401 that includes "read-data" is written from among the verification contents in the first verification-item list 400.

In a similar manner, a verification item of which the use case description is "write" and the sequential description is "write-data", the verification content, "is it possible to write write-data in a RAM properly?" of the verification item 402 that includes "write-data" is written. In addition, the verification contents of a review item, "is it possible to reset during read/write without causing a hang-up?" and the coverage (33%) calculated are written. The apparatus 200 may transmit the evaluation list 1300 to a computer terminal of a verification client, display on the display 108, or output the evaluation list 1300 from the printer 113.

Additional verification is verification that becomes necessary after the evaluation list 1300 is created. The additional verification is required due to update of the electronic specification for additional functions and sequences for the verification target. The additional verification can be carried out with the acquiring unit 201, the creating unit 204, the verification-item extracting unit 206, and the calculating unit 207.

Figure 14:
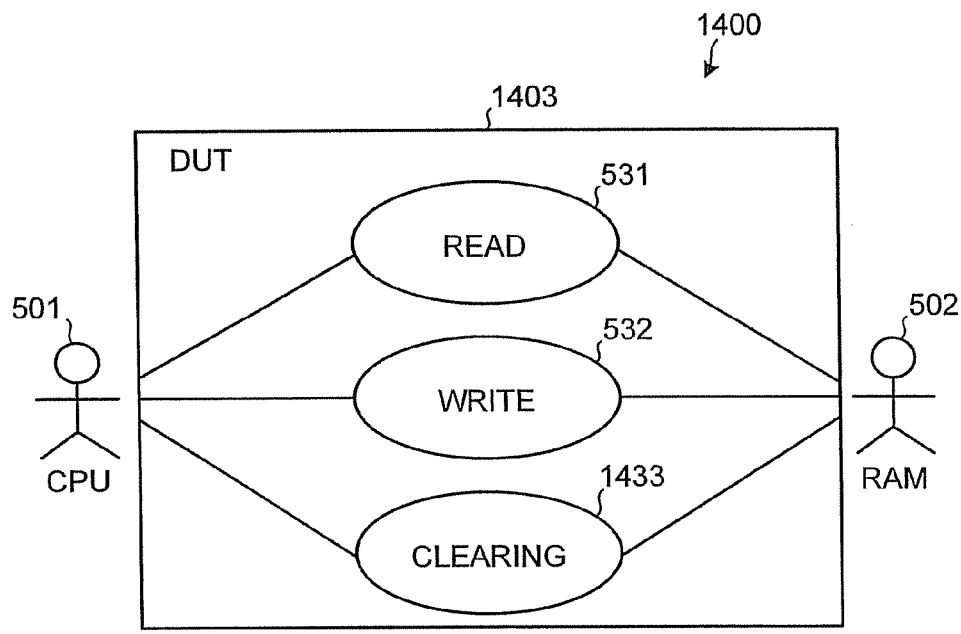
FIG. 14 is a schematic of a latest functional specification.
Figure 15:
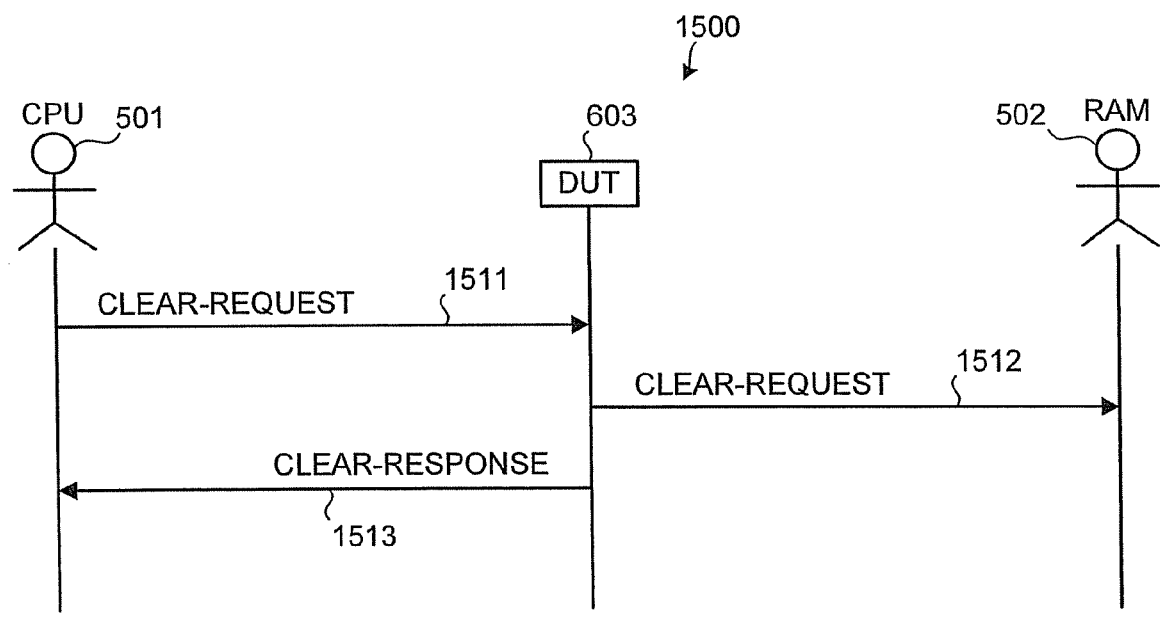
FIG. 15 is a schematic of a latest sequential specification.

Specifically, the acquiring unit 201 acquires a latest functional specification obtained by updating (adding, modifying, and deleting) the functional specification, and a latest sequential specification obtained by updating the sequential specification. FIG. 14 is a schematic of the latest functional specification, and FIG. 15 is a schematic of the latest sequential specification. A use case diagram 1400 written in the UML is shown in FIG. 14. The use case diagram 1400 indicates updated functions of the DUT 303.

In FIG. 14, like reference characters are given to like parts in FIG. 5, and same explanations are omitted. As system 1403 includes an additional use case description 1433 that indicates a clear function of the DUT303 in addition to the use case descriptions 531 and 532. A sequence diagram 1500, which is newly added, written in the UML is shown in FIG. 15. The sequence diagram 1500 indicates a clear action of the DUT 303, and includes the actors 501 and 502, the object 603, and messages 1511 to 1513.

The message 1511 is a sequential description that indicates an action of transmitting a clear-request from the actor 501 to the object 603. The message 1512 is a sequential description that indicates an action of transmitting the clear-request from the object 603 to the actor 502. The message 1513 is a sequential description that indicates an action of transmitting the clear-response from the object 603 to the actor 501.

The creating unit 204 creates a fourth verification-item list based on a functional description in the latest function al specification and a sequential description, which relates to the output action of the verification target, in the latest sequential specification. The fourth verification-item list is formed in a format in which a verification item in the fourth verification-item list is formed with the function description in the latest functional specification and the sequential description in the latest sequential specification.

According to the present embodiment, the use case diagram 1400 represents the latest functional specification, and the sequence diagrams 600, 700, and 1500 represent the latest sequential specification.

Therefore, the fourth verification-item list is formed in a format in which the verification item is formed with the use case description in the use case diagram 1400, the sequential description in the sequence diagram 600, the sequential description in the sequence diagram 700, and the sequential description in the sequence diagram 1500. Thus, even when the functional specification and the sequential specification are updated, the fourth verification-item list can be created in a same format as that of the second verification-item list. In other words, it is possible to uniform the formats before and after update of the electronic specifications.

In the additional verification, the creating unit 204 creates the fourth verification-item list in a similar manner to a creating process for the second verification-item list. FIG. 16 is a table of the fourth verification-item list. A fourth verification-item list 1600 shown in FIG. 16 is formed in the format in which a verification item in the fourth verification-item list is formed with the use case description and the sequential description (message). If the use case diagram 1400 shown in FIG. 14 is acquired, the use case descriptions in the fourth verification-item list 1600 are "read" of the use case description 531, "write" of the use case description 532, and "clear" of the use case description 1433.

Similarly, if the sequence diagrams 600 and 700 are acquired, the use case descriptions in the fourth verification-item list 1600 are the messages 613, 615, and 616 ("read-address", "read-response", and "read-data"), and the messages 714 to 716 ("write-address", "write-data", and "write-response").

A correspondence between the use case description and the sequential description can be determined based on a connection between the use case description and the actors in the use case diagram 1400, and the input and output of the messages that occur between the actors and the object in the sequence diagrams 600 and 700, and input and output of the messages that occur between the actors and the object in the sequence diagram 1500.

The verification-item extracting unit 206 extracts, from the fourth verification-item list 1600, verification items that are not included in the second verification-item list 1100. Specifically, the verification-item extracting unit 206 extracts the verification item of which the use case description is "clear" and the sequential description is "clear-request", and the verification time of which the use case description is "clear" and the sequential description is "clear-response" as the verification items that are not included in the second verification-item list 1100. Thus, the additional function and the additional sequence added in the electronic specification are automatically identified, and additional verification items that cover the additional function and the additional sequence can be automatically specified.

The calculating unit 207 calculates an additional verification requirement rate that indicates to what extent the additional verification is necessary for the latest functional specification and the latest sequential specification. The calculating unit 207 calculates the additional verification requirement rate based on the number of the verification items in the fourth verification-item list 1600 and the number of the verification items that are extracted from the fourth verification-item list 1600 as the verification items that are not included in the second verification-item list 1100. The additional verification requirement rate is expressed in a fraction or a percentage.

For example, the number of the verification items in the fourth verification-item list 1600 is eight. The number of the verification items extracted from the fourth verification-item list 1600 is two. Therefore, the additional verification requirement rate is $2/8$, that is 25%. With the additional verification requirement rate, it is possible to understand to what extent the verification items are added, and is possible to estimate work for the additional verification.

FIG. 17 is a table of an evaluation list obtained as a result of the additional verification. An evaluation list 1700 is obtained by updating the evaluation list 1300 shown in FIG. 13 reflecting results of the additional verification. Verification items of which the verification content includes a description, "completed" are verification items that have already been verified. Verification items of which the verification content includes a description, "added" are verification items that are newly added for the additional verification.

As described above, the apparatus 200 converts the format of the first verification-item list 400 into the format same as the format of the second verification-item list 1100 to create the third verification item list 1200 based on the second verification-item list 1100 and the verification keywords extracted. Thus, the formats of the first verification-item list 400 and the second verification-item list 1100 are unified. The format thus unified enables efficient comparison between the first verification-item list 400 and the second verification-item list 1100 at ease, and makes it possible to specify a redundant verification item and a missing verification item. Therefore, completeness in the verification can be improved.

The converting unit 205 converts the first verification-item list 400 in to the third verification item list 1200 by deleting the sequential descriptions extracted by the sequential description extracting unit 203 from among the sequential descriptions in the second verification-item list 1100. Thus, sequences to be verified that are missing in the first verification-item list 400 can be identified. In this manner, the redundant verification item and the missing verification item can be specified with high accuracy, thereby improving the completeness of verification.

Moreover, the verification-item extracting unit 206 extracts the verification item that is not included in the third verification item list 1200 from the second verification-item list 1100. Thus, the verification item that is missing in the first verification-item list 400 can be automatically identified. In this manner, the redundant verification item and the missing verification item can be specified with high accuracy, thereby improving the completeness in the verification, reducing human cost and time spent on the verification, and shortening the design period for the LSI.

Furthermore, the verification-content extracting unit 209 extracts the verification content that includes the verification keyword detected by the detecting unit 208 from among the verification contents in the first verification-item list 400. The verification content extracted is identified as the verification content that is required to be reviewed. By reviewing the verification content extracted, it is possible to obtain a clue for determining which the functional specification, the sequential specification, or the verification items listed up in the first verification-item list 400 an error is originated to.

Moreover, the creating unit 204 creates the fourth verification-item list 1600 based on the latest functional specification and the latest sequential specification. Thus, it is possible to create the fourth verification-item list 1600 that is formed in the format same as the format of the second verification-item list 1100. Therefore, for the fourth verification-item list 160, it is only necessary to perform the verification for the additional verification item. As a result, it is possible to carry out the verification process easily and efficiently, and is possible to improve the completeness of verification in the additional verification.

Furthermore, the verification-item extracting unit 206 extracts, from the fourth verification-item list 1600, the verification item that is not included in the second verification-item list 1100. Thus, the verification items that are newly added based on the latest functional specification and the latest sequential specification can be automatically identified. As a result, it is possible to improve the completeness of verification in the additional verification, to reduce the human cost and the time spent for the verification, and to shorten the design period for the LSI.

Moreover, the calculating unit 207 calculates the additional verification requirement rate that indicates to what extent the additional verification become necessary due to the update of the electronic specification. This enables to set a reference for completing the additional verification, and criteria for evaluating the completeness for the additional verification.

Figure 18:
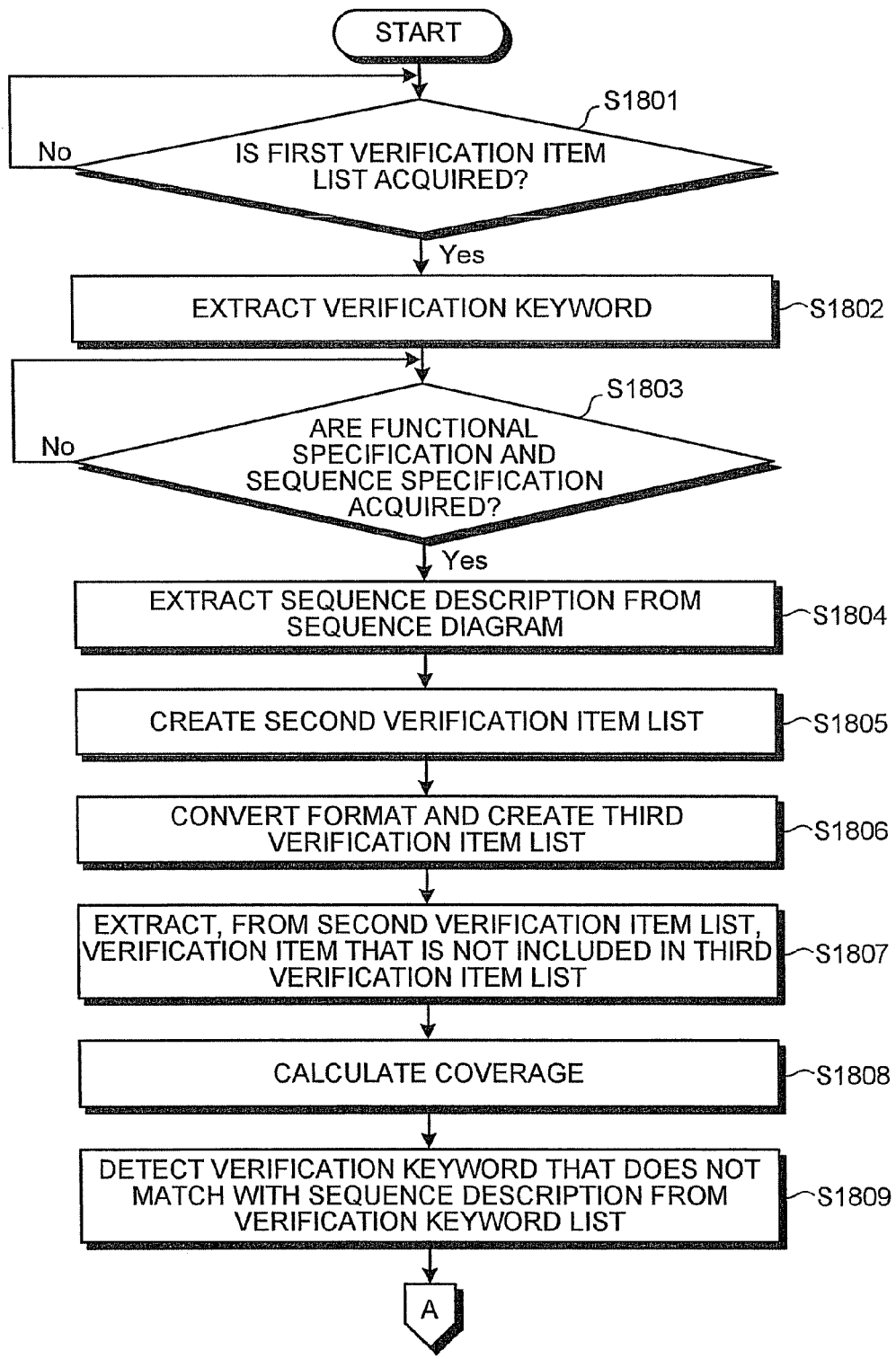
FIG. 18 is a flowchart of a procedure for a verification supporting process according to the present embodiment.
Figure 19:
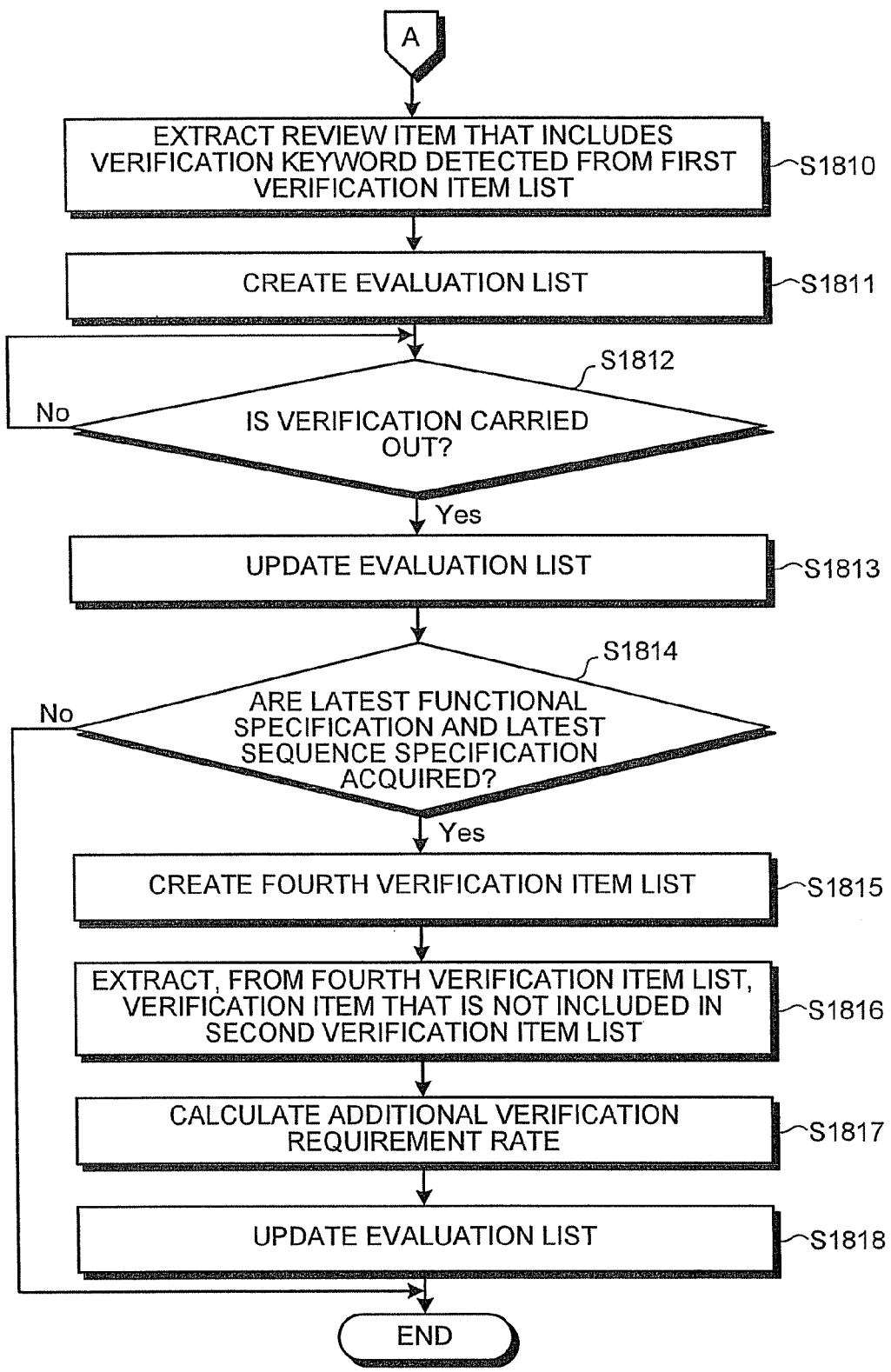
FIG. 19 is a flowchart of the procedure for the verification supporting process.

FIGS. 18 and 19 are flowcharts of a procedure for a verification supporting process according to an embodiment of the present invention. As shown in FIG. 18, when the acquiring unit 201 acquires the first verification-item list 400 ("YES" at step S1801), the keyword extracting unit 202 extracts the verification keyword (step S1802).

When the acquiring unit 201 acquires the functional specification (the use case diagram 500) and the sequential specification (the sequence diagrams 600 and 700) (YES at step S1803), the sequential description extracting unit 203 extracts the sequential description that relates to the output action of the DUT 303 from the sequence diagrams 600 and 700 for each of the use case descriptions (step S1804). Then, the creating unit 204 creates the second verification-item list 1100 (step S1805).

The format of the first verification-item list 400 is converted into the format same as the format of the second verification-item list 1100 (step S1806). Thus, the third verification item list 1200 is created. Then, the verification-item extracting unit 206 extracts the verification item that is not included in the third verification item list 1200 from the second verification-item list 1100 (step S1807).

The calculating unit 207 calculates the coverage (step S1808), and the detecting unit 208 detects the verification keywords ("reset" and "hang-up") that do not match with the sequential description in the sequence diagrams 600 and 700 (step S1809).

Then, as shown in FIG. 19, the verification-content extracting unit 209 extracts the verification content that includes the verification keywords detected (step S1810). The evaluation list 1300 is created (step S1811). The evaluation list 1300 can be provided to the verification client. When the verification is carried out for the DUT 303 ("YES" at step S1812) after the evaluation list 1300 is created, the evaluation list 1300 is updated (step S1813). Thus, the verification content "added" is updated to "completed" in the evaluation list 1300.

When the latest functional specification (the use case diagram 1400) and the latest sequential specification (the sequence diagrams 600 and 700) are not acquired ("NO" at step S1814) after step S1813, the process is finished. On the other hand, when the latest functional specification (the use case diagram 1400) and the latest sequential specification (the sequence diagrams 600 and 700) are acquired ("YES" at step S1814), the creating unit 204 creates the fourth verification-item list 1600 (step S1815).

The verification-item extracting unit 206 extracts the verification item that is not included in the second verification-item list 1100, namely, the verification item of which the use case description is "clear" and the sequential description is "clear-request", and the verification item of which the use case description is "clear" and the sequential description is "clear-response" (step S1816). The calculating unit 207 calculates the additional verification requirement rate (step S1817), and the evaluation list 1300 is updated (step S1818). Thus, the evaluation list 1700 is obtained.

Thus, according to the verification supporting process, it is possible to avoid the verification process that requires a lot of time and more than one member to be involved as in the conventional review. In other words, although the conventional review requires 3 to 10 people or more as the reviewing members spending two hours to half a day, according to the present invention, it is possible to determine the completeness of verification of the verification item list in a free format in a short time of about one minute.

Moreover, unlike the conventional review, it is possible to improve and uniform the quality of the verification item without depending on the experience and the ability of the members involved in the review. It is also possible to automatically extract a redundant verification item and a missing verification item, thereby shortening the verification period.

Furthermore, it is possible to set a reference for completing the verification process, and to secure the completeness of verification. In addition, in a service for extracting a verification item, because just a missing verification item can be extracted with high accuracy, it is possible to improve reliability of the service. Thus, it is possible to charge an appropriate value for the service.

Moreover, the redundant verification item and the missing verification item are extracted based on comparison between the second verification-item list 1100 that is automatically obtained from the electronic specification and the first verification-item list 400, which is an evaluation target. Even when there is an error in the first verification-item list 400, if the review item is extracted, it is possible to detect the error in the electronic specification that is a factor of a redundant description or a missing description by reviewing the review item.

Furthermore, when an additional description is added to the electronic specification, it is possible to automatically extract an additional verification item from the second verification-item list 1100. Therefore, by limiting the verification item on which the verification is carried out to the additional verification item, it is possible to shorten the verification period.

As described above, with the method and the apparatus for supporting verification, and the computer product according to the present embodiments of the present invention, the verification item is automatically extracted from the verification item list in a free format easily and efficiently. Therefore, it is possible to improve the completeness of verification, to reduce the human cost, and to shorten the design period for the LSI.

The method for supporting verification that is explained in the present embodiment of the present invention is implemented by executing a computer program prepared in advance by a computer, such as a personal computer and a workstation. The computer program is recorded in a computer-readable recording medium, such as the CD-ROM, the MO, and the DVD, and is executed by the computer reading out from the recording medium. The computer program may be a transmission medium that is distributed through a network such as the Internet.

According to the present invention, it is possible to improve the completeness of verification, to reduce the human cost, and to shorten the design period for the LSI.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for supporting a verification of a target device by outputting a list of verification items, comprising:
   a verification-keyword extracting unit that extracts a plurality of verification keywords from a first list in which a plurality of operations of the target device to be verified are described;
   a creating unit that creates, based on a use case diagram and a sequence diagram of the target device, a second list in which each use described in the use case diagram and each message described in the sequence diagram are associated with each other;

a first-item extracting unit that extracts, from the second list, a first item that does not include any one of the verification keywords;

a second-item extracting unit that extracts, from the first list, a second item that includes any one of the verification keywords that are not included in the second list;

a second creating unit that creates a third list including an item that includes any one of the verification keywords by deleting the first item from the second list; and an output unit that outputs the list of verification items in which the first list and the second list are included and the first item and the second item are associated with a first identifier and a second identifier respectively.

2. The apparatus according to claim 1 wherein the first-item extracting unit extracts the first item by deleting, from the second list, the item included in the third list.

3. The apparatus according to claim 1, further comprising:
a calculating unit that calculates a ratio of a total number of items in the third list to a total number of items in the second list.

4. The apparatus according to claim 1, wherein when any one of the use case diagram and the sequence diagram is updated, the creating unit creates a fourth list based on an updated use diagram and an updated sequence diagram, the first-item extracting unit extracts, from the fourth list, an item that is not included in the second list, and the output unit outputs an updated list of verification items in which the list of verification items and the item extracted by the first-item extracting unit are included.

5. The apparatus according to claim 4, further comprising:
a calculating unit that calculates a ratio of a number of items extracted by the first-item extracting unit to a total number of items in the fourth list.

6. A method for supporting a verification of a target device by outputting a list of verification items, comprising:
extracting a plurality of verification keywords from a first list in which a plurality of operations of the target device to be verified are described;

creating, based on a use case diagram and a sequence diagram of the target device, a second list in which each use case described in the use case diagram and each message described in the sequence diagram are associated with each other;

extracting, from the second list, a first item that does not include any one of the verification keywords;

extracting, from the first list, a second item that includes any one of the verification keywords that are not included in the second list;

creating a third list including an item that includes any one of the verification keywords by deleting the first item from the second list; and outputting the list of verification items in which the first list and the second list are included and the first item and the second item are associated with a first identifier and a second identifier respectively, wherein the extracting and the outputting are performed by a computer.

7. The method according to claim 6, further comprising: extracting includes extracting the first item by deleting, from the second list, the item included in the third list.

8. A computer-readable recording medium that stores therein a computer program for supporting a verification of a target device by outputting a list verification items, wherein the computer program causes a computer to execute:
extracting a plurality of verification keywords from a first list in which a plurality of operations of the target device to be verified are described;

creating, based on a use case diagram and a sequence diagram of the target device, a second list in which each use case described in the use case diagram and each message described in the sequence diagram are associated with each other;

extracting, from the second list, a first item that does not include any one of the verification keywords;

extracting, from the first list, a second item that includes any one of the verification keywords that are not included in the second list;

creating a third list including an item that includes any one of the verification keywords by deleting the first item from the second list; and outputting the list of verification items in which the first list and the second list are included and the first item and the second item are associated with a first identifier and a second identifier respectively.

9. The computer-readable recording medium according to claim 8, further comprising: extracting the first item by deleting, from the second list, the item included in the third list.

* * * * *

UNITED STATES PATENT AND TRADEMARK OFFICE
CERTIFICATE OF CORRECTION

PATENT NO. : 7,685,546 B2  Page 1 of 1
APPLICATION NO. : 11/747026
DATED : March 23, 2010
INVENTOR(S) : Kenji Abe It is certified that error appears in the above-identified patent and that said Letters Patent is hereby corrected as shown below:

Column 16, claim 7, line 2, delete "extracting includes".

Signed and Sealed this

Fifteenth Day of June, 2010

David J. Kappos
*Director of the United States Patent and Trademark Office*